US008510628B2

(12) United States Patent
Bedeschi et al.

(10) Patent No.: US 8,510,628 B2
(45) Date of Patent: Aug. 13, 2013

(54) METHOD AND APPARATUSES FOR CUSTOMIZABLE ERROR CORRECTION OF MEMORY

(75) Inventors: Ferdinando Bedeschi, Biassono (IT); Paolo Amato, Pagazzano (IT); Roberto Gastaldi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 720 days.

(21) Appl. No.: 12/617,661

(22) Filed: Nov. 12, 2009

(65) Prior Publication Data

US 2011/0113303 A1 May 12, 2011

(51) Int. Cl.
*G11C 29/00* (2006.01)
(52) U.S. Cl.
USPC .......................... 714/763; 714/746; 714/777
(58) Field of Classification Search
USPC .......................................... 714/746, 763, 777
See application file for complete search history.

(56) References Cited

U.S. PATENT DOCUMENTS

| 2003/0217323 A1* | 11/2003 | Guterman et al. | 714/763 |
| 2007/0226599 A1* | 9/2007 | Motwani | 714/792 |
| 2008/0155380 A1* | 6/2008 | Guterman et al. | 714/764 |

OTHER PUBLICATIONS

"Korean Application Serial 10-2010-0111531, Office Action mailed Jun. 29, 2012", With English Translation, 9 pgs.

* cited by examiner

*Primary Examiner* — Charles Ehne
(74) *Attorney, Agent, or Firm* — Schwegman, Lundberg & Woessner, P.A.

(57) ABSTRACT

Described herein are a method and apparatuses for providing customizable error correction for memory arrays. In one embodiment, an apparatus includes a memory device having a memory array to store data and an analog to digital sense unit coupled to the memory array. The analog to digital sense unit senses analog signals associated with the memory array and converts the analog signals into distributions of digital values. An error-correcting code (ECC) unit receives the distributions of digital values from the analog to digital sense unit. A configurable non-volatile look-up table generates ECC parameters including error probability data and provides the ECC parameters to the ECC unit for error correction. The error probability data has error probability values that are associated with the distributions of digital values. The ECC unit executes an ECC algorithm to provide error correction using the error probability data.

14 Claims, 7 Drawing Sheets

METHOD AND APPARATUSES FOR CUSTOMIZABLE ERROR CORRECTION OF MEMORY

BACKGROUND

1. Field of the Invention

Embodiments of the present invention relate generally to the field of error correction in memory. More particularly, embodiments of the present invention relate to customizable error correction with analog sensing.

2. Description of the Related Art

Electronic devices may require error correction for accessing memory contained within these devices. An error-correcting code (ECC) or forward error correction (FEC) code is redundant data that is added to the message on the sender side. If the number of errors is within the capability of the code being used, the receiver can use the extra information to discover the locations of the errors and correct them. Error-correcting codes are used in computer data storage.

Future high density memory, in particular Non-Volatile memory, will exhibit high raw bit error rate in the range of 10E-3 due to technology scaling. Typical ECC machines do not work well enough for these requirements. Additionally different ECC requirements and different product developments cause design, development, test, and manufacturing cost issues as well as additional time to market.

BRIEF DESCRIPTION OF THE DRAWINGS

One or more embodiments of the present invention are illustrated by way of example and not limitation in the figures of the accompanying drawings, in which like references indicate similar elements and in which.

DETAILED DESCRIPTION

Described herein are a method and apparatuses for providing customizable error correction for memory arrays. In one embodiment, an apparatus includes a memory device having an array of memory cells to store data. The memory cells are organized in n rows and m columns. The apparatus also includes decoding means to select and properly bias these cells and an analog to digital sense unit coupled to the memory array. The analog to digital sense unit senses analog signals associated with the memory array cells (e.g., current or threshold voltage) and converts the analog signals into distributions of digital values. The apparatus also includes an error-correcting code (ECO) unit coupled to the analog to digital sense unit. The ECC unit receives the distributions of digital values from the analog to digital sense unit. A configurable look-up table generates ECC parameters including error probability data and provides the ECC parameters to the ECC unit for error correction. The error probability data includes error probability values that are associated with the distributions of digital values. The ECC unit executes an ECC algorithm to provide error correction using the error probability data.

Figure 1:
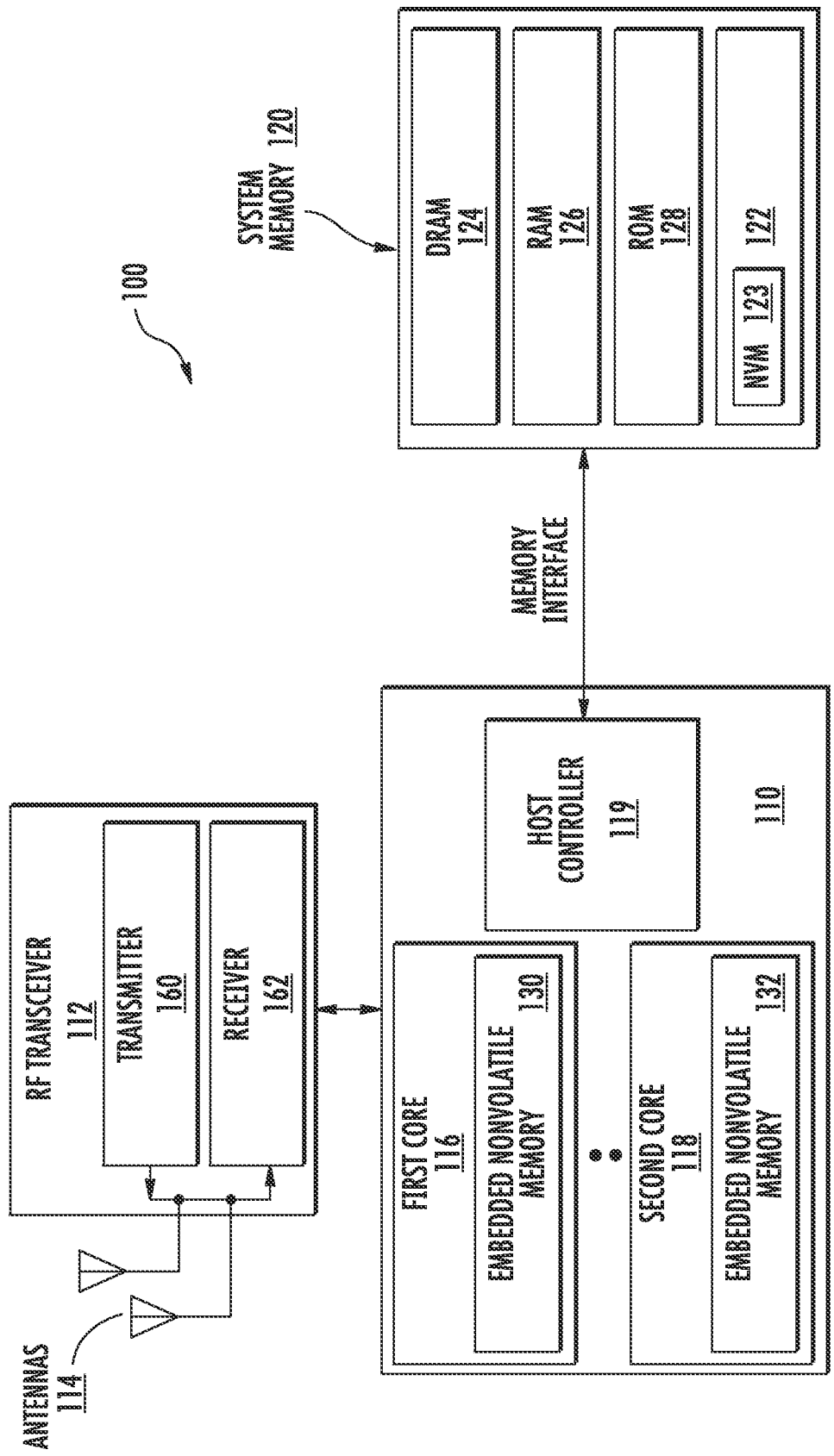
FIG. 1 illustrates a data processing device in accordance with one embodiment.

The configurable look-up table updates error probability data based on the distributions of analog signals. The sensed analog signals associated with the memory array and corresponding digital values may change during the product life of the memory array for example due to the spread in the fabrication process or to variations in voltage and/or temperature operating conditions. The configurable look-up table provides a great flexibility in being able to update the "error probability" assigned to each digital value. In case of variations related to temperature or voltage operation error probabilities can be changed utilizing the inputs coming from a voltage and temperature sensor to update the look-up table values FIG. 1 illustrates a data processing device with memory access and error correction in accordance with one embodiment. The data processing device 100 includes a processing unit 110 having first and second processor cores 116 and 118, a host controller 119, and a system memory 120 coupled to the processing unit 110. The host controller 119 can be internal to the processing unit 110 or external to the processing unit 110. The first and second processing cores 116 and 118 include embedded non-volatile memory 130 and 132, respectively. The system memory 120 includes a circuit device 122, which may be an integrated circuit device, and various types of memory (e.g., DRAM 124, RAM 126, ROM 128). The circuit device 122 provides non-volatile memory access (e.g., NVM 123) with customizable error correction using an analog to sense unit, a look-up table, and an ECC unit. These components will be discussed in more detail in conjunction with FIGS. 2, 3, and 5. The customizable error correction of the present disclosure may also be implemented for accessing the memory 130 and 132 and they can be internal to the NVM 123 or driven by the host controller 119

The data processing device 100 may optionally include a transceiver 112 coupled to the processing unit 110. The transceiver 112 receives over-the-air signals with antennas 114 and includes a transmitter 160 and a receiver 162. As shown in this wireless embodiment, data processing device 100 includes one or more antenna structures 114 to allow radios to communicate with other over-the-air data processing devices. As such, data processing device 100 may operate as a cellular device or a device that operates in wireless networks. The radio subsystems collocated in the same platform of device 100 provide the capability of communicating with different frequency bands in an RF/location space with other devices in a network. It should be understood that the scope of the present invention is not limited by the types of, the number of, or the frequency of the communication protocols that may be used by data processing device 100.

The embodiment illustrates the coupling of antenna structure 114 to a transceiver 112 to accommodate modulation/demodulation. In general, analog front end transceiver 112 may be a stand-alone Radio Frequency (RF) discrete or integrated analog circuit, or transceiver 112 may be embedded with a processor having one or more processor cores 116 and 118. The multiple cores allow processing workloads to be shared across the cores and handle baseband functions and application functions. An interface may be used to provide communication or information between the processor and the memory storage in a system memory 120.

System memory 120 may be provided by one or more different types of memory and may include both optional DRAM, RAM, and/or ROM and the circuit device 122 having non-volatile memory (NVM) 123. The NVM 123 may include a phase change material. NVM 123 may be referred to as a Phase Change Memory (PCM), Phase-Change Random Access Memory (PRAM or PCRAM), Ovonic Unified Memory (OUM) or Chalcogenide Random Access Memory (C-RAM). NVM 123 may include flash memory (e.g., NOR, NAND), solid state drive, and card/stick memory.

Figure 2:
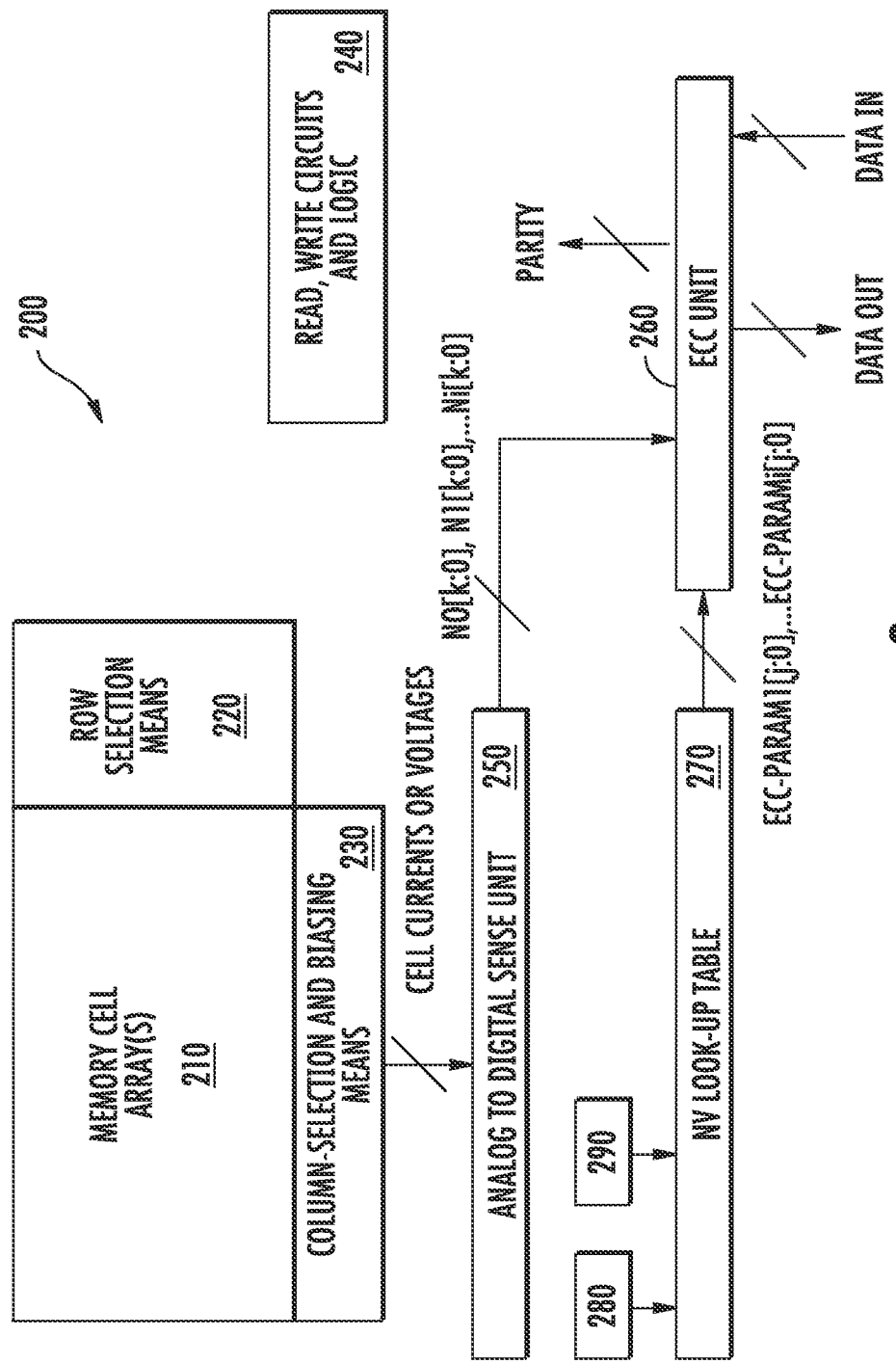
FIG. 2 illustrates an apparatus that provides memory access with customizable error correction in accordance with one embodiment.

FIG. 2 illustrates an apparatus that provides memory access with customizable error correction in accordance with one embodiment. The apparatus 200 (e.g., circuit device 122) includes one or more arrays 210 of memory cells (e.g., NVM 123) that store data. A row selecting unit 220 and column selecting and biasing unit 230 are used to access the array 210. Read and write circuits and logic 240 control the row and column selecting units for providing memory access. An analog to digital sense unit 250 is coupled to the memory array 210. The analog to digital sense unit 250 senses analog signals associated with memory cells of the memory array and converts the analog signals into one or more distributions of digital values as will be described in more detail in conjunction with the description of FIGS. 4-6. The analog signals may include distributions of current or voltage values associated with logical states (e.g., 0, 1, 00, 01, 10, 11) of the memory cells. User data and parity information may also be sent to the analog to digital sense unit 250 from the array 210.

In one embodiment, an error-correcting code (ECC) unit 260 is coupled to the analog to digital sense unit 250. The ECC unit 260 includes an encoding and decoding machine that receives the distribution of digital values (e.g., N0[k:0], N1[k:0], ... Ni[k:0]) from the analog to digital sense unit 250 and executes an ECC algorithm to provide error correction using the error probability data provided by the look-up table 270 for one or more arrays. The look-up table can be updated by updating distributions of digital values. The ECC algorithm can be stored in the ECC unit in memory (e.g., ROM) and implemented with a microcontroller or the algorithm can be implemented as finite state machine or as a boolean circuit.

A configurable non-volatile look-up table 270 is coupled to the ECC unit 260. The configurable non-volatile look-up table 270 generates ECC parameters (e.g., ECC parameter 1[j:0], ... ECC parameter i[j:0]) including the error probability data and provides the ECC parameters to the ECC unit 260 for error correction. The configurable non-volatile look-up table 270 may be external or integrated with the ECC unit 260. The configurable non-volatile look-up table updates error probability data based on variations in the cells current or variations in the resistance or threshold voltage distribution in the array. These variations may be detected for example during wafer testing or upon initiation of the apparatus or upon a given reading state. Moreover, the error probability data may be updated as a consequence of variations in the operating temperature and/or voltage detected by suitable voltage sensor 280 and temperature sensor 290. The error probability values are based on a distance of a digital value in a distribution from a reference level as will be described in more detail in conjunction with the description of FIG. 4.

In one embodiment, the analog to digital sense unit 250 senses analog signals associated with memory cells of the memory array in order to provide initial digital values. In other embodiments, the analog to digital sense unit senses analog signals associated with memory cells of the memory array based on variations in the cells current or variations in the resistance or threshold voltage distribution in the array to update the digital values. The analog signals and corresponding digital values may change during the product life of the memory array. Different types of products with different types of memory may have different analog signals as well.

The look-up table 270 provides a great flexibility in updating the "error probability" assigned to each digital value even during the product life. Process variations, different product specifications (e.g., less or more read/write cycles, different temperature ranges, process parameter fine tuning, etc.) are tracked and stored in the look-up table. Different reliability criteria as well as different expected programmed memory cell distributions can be correlated with error probabilities per given reading state and this information can be sent to the ECC unit. The ECC unit uses this information from the look-up table to optimize the error correction for the particular requirements without any new mask order. The subsequent product qualification phase is also greatly reduced.

For example, an analog read and conversion to digital values can be performed during electrical wafer sort, electrical characterization, or product qualification. A memory cell distribution after programming, like current or voltage distribution, can be partitioned into different and discrete populations of cells with each having a different statistical probability of being correctly placed in a logical state after a programming pulse or algorithm. In this manner, the probabilities can be usefully collected in the look-up table and utilized during the error correction by the ECC unit.

Figure 3:
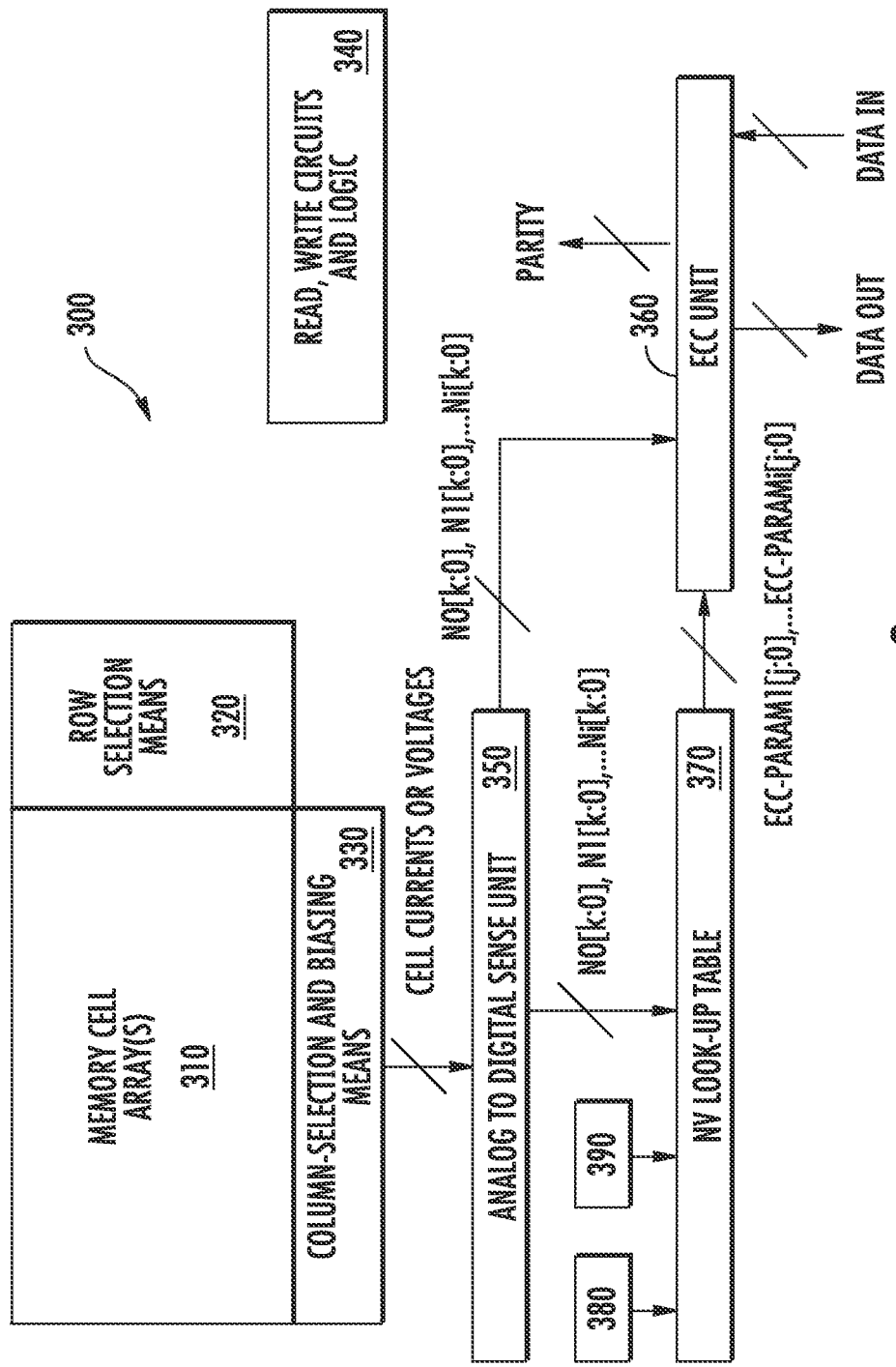
FIG. 3 illustrates an apparatus that provides memory access with customizable error correction in accordance with another embodiment.

FIG. 3 illustrates an apparatus that provides memory access with error correction in accordance with another embodiment. The apparatus 300 (e.g., circuit device 122) includes one or more arrays 310 of memory cells that store data. A row selecting unit 320 and column selecting and biasing unit 330 are used to access the array 310. Read and write circuits and logic 340 control the row and column selecting units for providing memory access. An analog to digital sense unit 350 is coupled to the memory array 310. The analog to digital sense unit 350 senses analog signals associated with memory cells of the memory array and converts the analog signals into distributions of digital values In an embodiment, an error-correcting code (ECC) unit 360 is coupled to the analog to digital sense unit 350. The ECC unit 360 receives the distributions of digital values (e.g., N0[k:0], N1[k:0], ... Ni[k:0]) from the analog to digital sense unit 350 and receives error probability data from the look-up table 370. The ECC unit 360 executes an ECC algorithm to provide error correction using the error probability data, which can be updated with each updated distribution of digital values.

A configurable non-volatile look-up table 370 receives the distributions of digital values from the unit 350. The configurable non-volatile look-up table 370 generates ECC parameters (e.g., ECC parameter 1[j:0], ... ECC parameter i[j:0]) including the error probability data and provides the ECC parameters to the ECC unit 360 for error correction. The configurable non-volatile look-up table 370 may be external or integrated with the ECC unit 360. The configurable non-volatile look-up table updates error probability data based on when the distributions of digital values are updated. For example, the error probability data may be updated as a consequence of variations in the operating temperature and/or voltage detected by suitable voltage sensor 380 and temperature sensor 390.

In another embodiment, the distributions of digital values are only provided to the look-up table 370 and not to the ECC unit 360. The ECC unit 360 accesses the table 370 in order to have updated error probability data and can store this data in memory located in the ECC unit 360.

Future large capacity memories (e.g., NAND, NOR, PCM) will have higher and higher error probability in correctly retrieving the data stored, which is called the Raw Bit Error Rate (RBER), due to pushing the technology to its limits. Usually this problem is managed implementing an ECC machine that is able to correct a number of errors over a string of data. As a consequence of the ECC action the final Bit Error Rate is an order of magnitude lower than the starting one. Most widely used ECC machines are based on a code (e.g., Bose Ray-Chaudhuri Hocquenghem) that is effective provided that the Raw Bit Error Rate (RBER) is not too high. However, due to technology scaling this condition will likely not be met in the near future.

Another class of ECC codes can be used which are more effective at high RBER, the Soft Decoded codes (e.g., the so called convolutional codes), but to work they need to have as input not only a string of 0 and 1's, but also the "reliability" of the data, or in other words what is the probability that a 0 (or 1) received was "really" a 0 (or 1) transmitted. This cannot be done with a traditional sense amplifier but needs a new concept as shown in FIG. 4.

Figure 4:
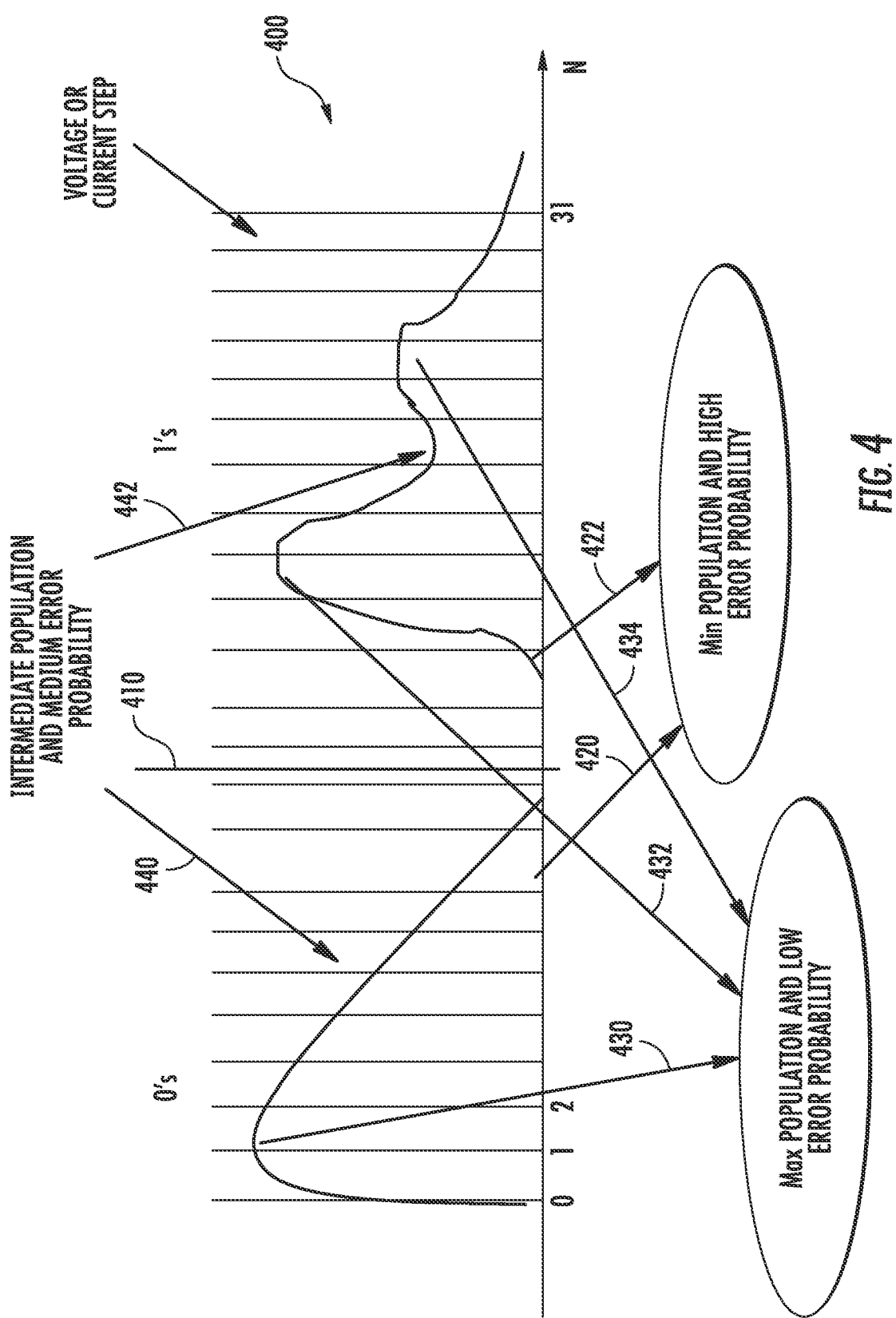
FIG. 4 illustrates cell current or voltage threshold distributions and a possible grid of digital values generated by an analog to digital sense unit in accordance with one embodiment.

FIG. 4 illustrates distributions of digital values generated by an analog to digital sense unit in accordance with one embodiment. The whole space of analog values (e.g., currents, resistances or threshold voltages) that a typical memory array of cells can assume is partitioned in a number N of "slices" identified by a binary code, so that each cell in the distributions is assigned from the sense circuit to a defined slice. Each slice is characterized by a different "error probability" of the represented data based on the "distance" of that particular slice from the reference level 410. For example, the data (e.g., 420 and 422) associated with the slices located closer to the reference level 410 will have higher error probability and lower reliability because it is more likely that they are the result of an error in the reading because of the sense precision limit or the existence of "tails" of one the distributions crossing the reference level. The data (e.g., 430, 432, 434) associated with the slices located further from the reference level 410 or near a maximum population slice will have lower error probability and higher reliability because it is less likely that they are the result of an error in the reading. The data (e.g., 440 and 442) associated with the slices located near an intermediate population slice will have a moderate error probability and moderate reliability.

In some embodiments, the look-up table includes a reprogrammable (NVM) register where the error probabilities or certain parameters related to error probabilities of the slices are stored. The digital values in the look-up table are used to select a given error probability or other useful information (e.g., ECC parameter [k:0]). The ECC parameters can be combined with other similar information coming from the overall codeword read from the memory array and sent to the ECC unit.

In some embodiments the slices are not fixed a priori but can change from device to device, or during the device lifetime.

The ECC unit can retrieve the information about the slice where a particular cell is located and the related error probability and other information (e.g., parity information, N number of slices, product data sheet information, etc.) from the look-up table, combine them, and then implement a convolutional code to effectively reduce the Bit Error Rate. The look-up table provides significant flexibility in changing the "error probability" assigned to each slice even during the product life according to the model of the memory cells array, disturbing factors, process variations, writing speed requirements, endurance and in general reliability specifications and so on. Thus, the present design greatly increases the effectiveness of the ECC unit itself. The look-up table (e.g., non-volatile registers) is customizable in various ways (e.g., by die, by wafer, by lot).

An ECC that takes into account reliability information (e.g., probabilities, likelihood values, etc.) is called a soft-decision algorithm. The present ECC design uses soft decoding. ECC machines that use only received bit values are called hard-decision algorithms. Generally, soft decoding can provide up to 3 dB of gain in Signal-to-noise ratio in comparison to hard decoding. In other words, a hard-decision ECC can give the same performance of a soft-decision ECC working on a bit error rate which is three orders of magnitude greater. Soft-decision techniques include convolutional codes, trellis-coded modulation, turbo codes, and low-density parity check (LDPC) codes. The effective ability of generating reliability information enables the application of soft-decision ECC even for an on-chip ECC controller. The present design can be used for concatenated or non-concatenated codes.

Prior approaches for error correction do not use a look-up table. The evaluation of error probabilities is done through mathematical assumptions, for example assuming Gaussian distributions. In this way there is no possibility to adapt the error probabilities to more accurate, characterization based modeling of the array distributions or to change them as a result of modifications of external conditions (such as for example all those above mentioned).

Figure 5:
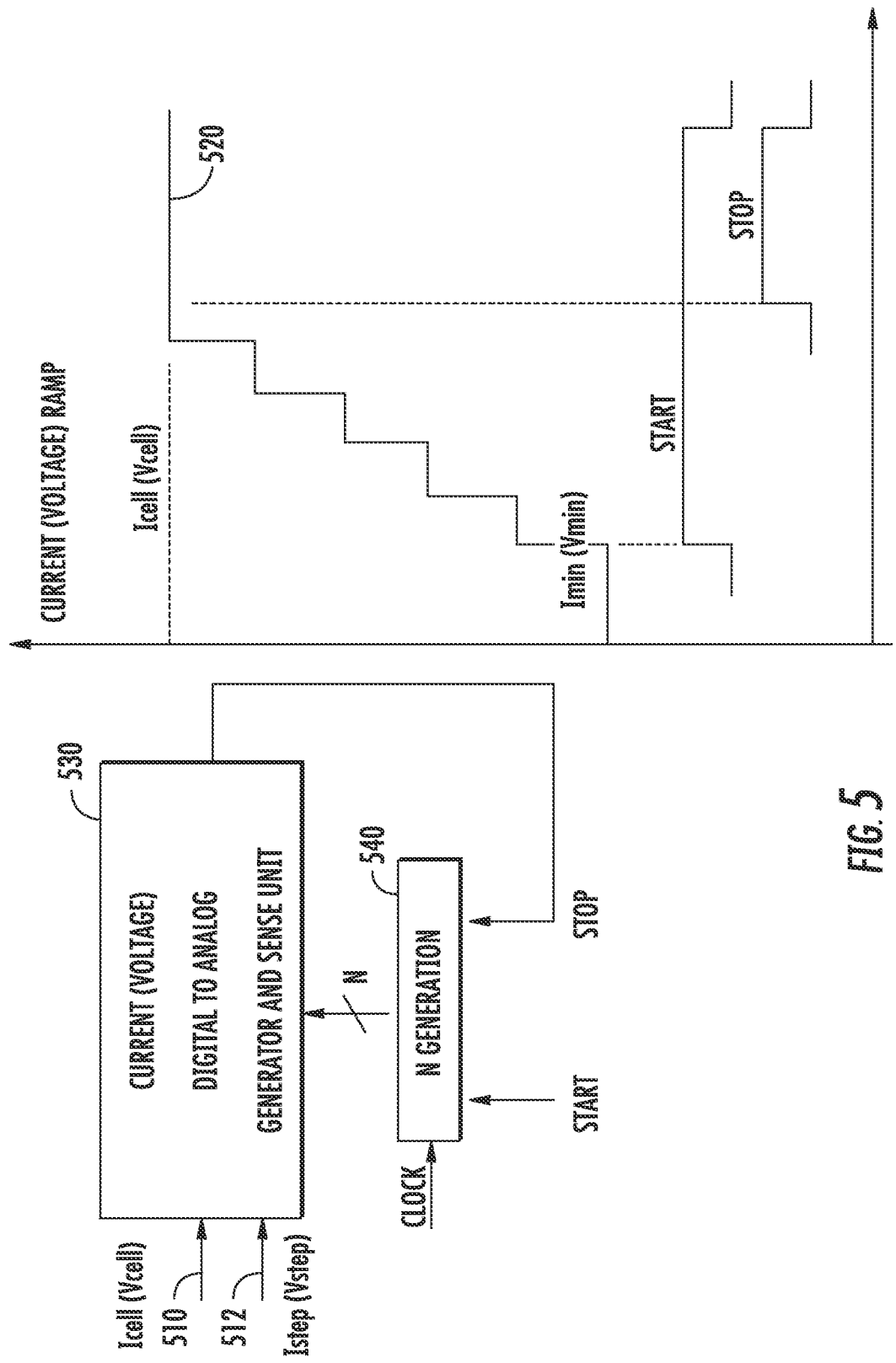
FIG. 5 illustrates an exemplary implementation of an analog to digital sense unit in accordance with one embodiment.

FIG. 5 illustrates an exemplary implementation of an analog to digital sense unit in accordance with one embodiment. Analog signals are sensed from the memory cells and form the input 510 in terms of current Icell or voltage Vcell. A current or voltage ramp 520, In(x), is used to convert the current or voltages sensed from the memory cells into digital values. A digital to analog generator and sense unit 530 receives the input 510 and a current or voltage step (or a continuous ramp) input signal 512. The unit 530 outputs a stop signal that is received as an input for a N generation unit 540. This unit 540 also receives a start signal input.

In one embodiment, the unit 530 generates an analog level of current or voltage ramp signal 520 depending on the initial value of N and a reference input signal Istep (Vstep) 512. The generated ramp signal 520 equals N times Istep (Vstep) 512 and is used as a comparison level; N is a function of 2 logic signals, start and stop, and one clock signal. N is 0 if the start signal is 0. N is incremented by 1 at every clock cycle (N=N+1) if the memory cell's current (Icell) 510 is greater than the generated current N*Istep and a new current equal to (N+1)*Istep is generated. This condition with N being incremented corresponds to the start signal being equal to 1 and the stop signal being equal to 0. The above loop continues until the cell's current is lower than the generated level. When the cell current is equal to or exceeds the comparison current, a stop signal is asserted, the generated current equal to N*Istep is kept constant (N remains as N) and the cell's current is quantized into n-bits digital output which is latched, then representing N itself. The same principle can be applied if sensed and generated current levels are substituted with sensed and generated voltage levels.

Figure 6:
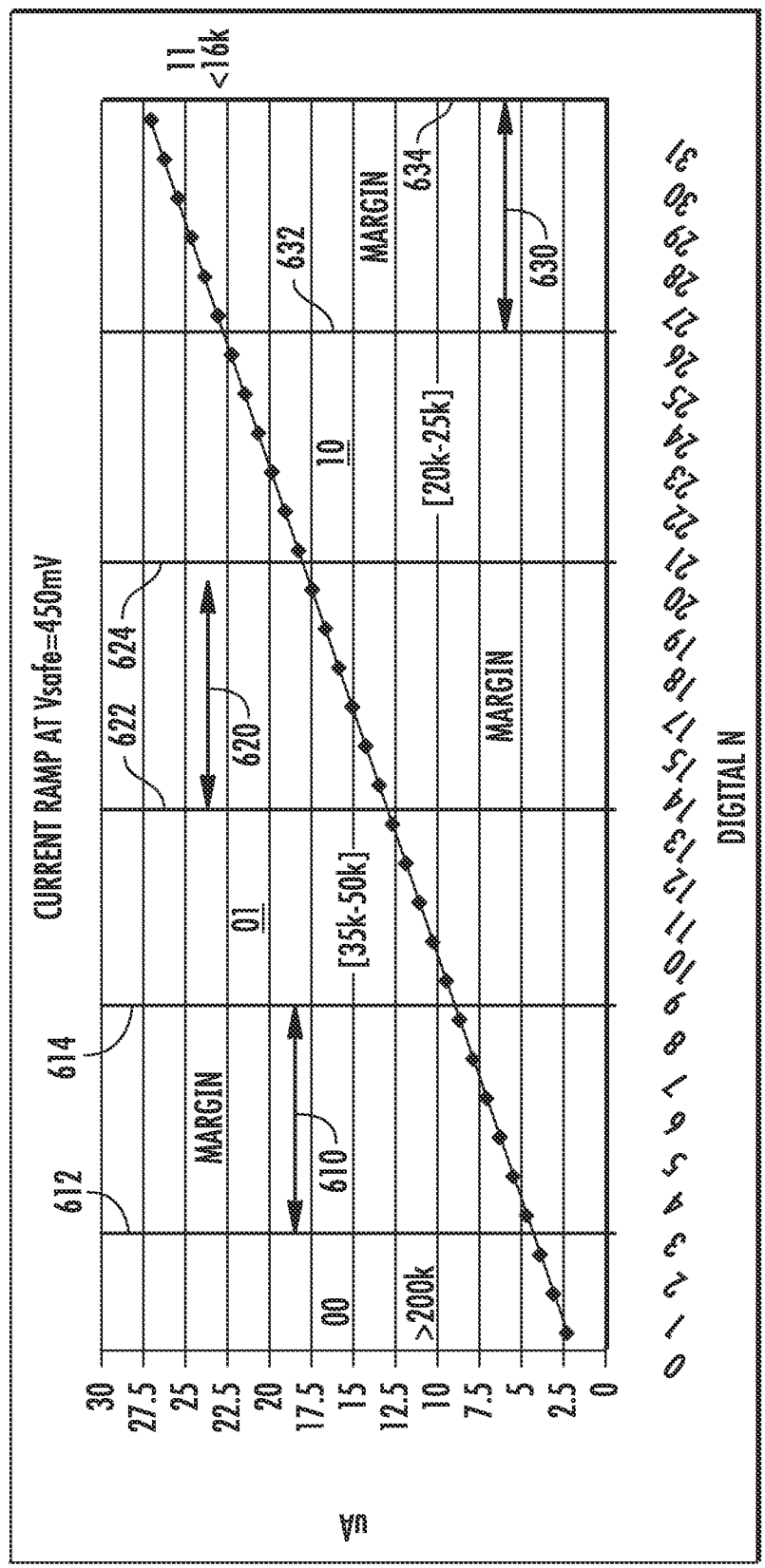
FIG. 6 illustrates distributions of digital values generated by an analog to digital sense unit in accordance with another embodiment.

FIG. 6 illustrates distributions of digital values generated by an analog to digital sense unit in accordance with another embodiment. The whole space of 00, 01, 10, and 11 logic states for a typical multi-level (e.g., 2 bits/cell in this case, 1.5 bits/cell, 3 bits/cell, 4 bits/cell, etc.) memory array of cells (e.g., PCM) is partitioned in a number N of "slices", so that each cell in the distributions is assigned from the sense circuit to a defined slice. Each slice is characterized by a different "error probability" of the represented data, based on the "distance" of that particular slice from a reference level or margin. For example, margins 610, 620, and 630 are defined by references levels 612, 614, 622, 624, 632, and 634, respectively.

In an embodiment, FIG. 6 illustrates a current ramp when biasing the cell storage element at Vsafe equal to 450 millivolts for a multi-level cell (MLC) memory (e.g., PCM). In particular, a 2 bit/cell device having 4 logic states (e.g., 00, 01, 10, and 11). PCM memory cells can be modeled as a variable resistor that can assume different values depending on the phase of the chalcogenide material. If the material is amorphous, which corresponds to a reset state 00, the related resistance is very high ranging from some hundreds of Kohms to more than 1 Mohm. If the material is crystalline, the related resistance is in the range of some Kohms (e.g., less than 15 Kohms). A current (or voltage) pulse of suitable shape, width and amplitude is used to switch from one phase to the other. For MLC operation, intermediate states are used and these states are characterized by intermediate resistance values. For example, a reset state 00 has a resistance greater than 200 Kohm. A first intermediate state 01 has a resistance between 35 and 50 Kohm. A second intermediate state 10 has a resistance between 20 and 25 Kohm. A set state 11 has a resistance less than 16 Kohm.

The data falling into a slice having a resistance in one of the margins or close to one of the margins will have higher error probability and lower reliability because it is more likely that this data is the result of an error in the reading compared to data falling into a slice (e.g., 12) that has a resistance in the middle of one of the logical states. The transition between different logical states may also be driven by relative probabilities in a continuous way without specifying any margin window.

Figure 7:
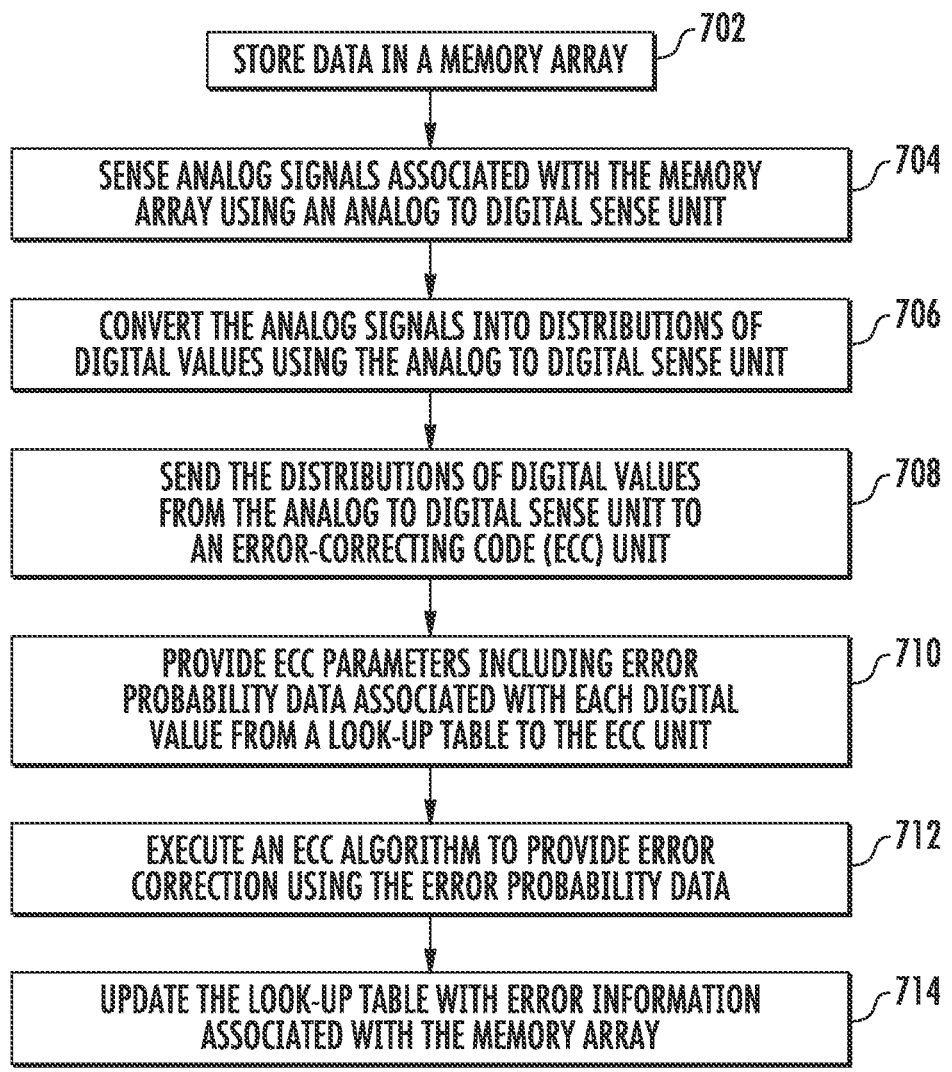
FIG. 7 illustrates a method for error correction in a memory device in accordance with one embodiment.

FIG. 7 illustrates a method for error correction in a memory device having a memory array in accordance with one embodiment. The method includes storing data in the memory array at block 702. The method includes sensing analog signals associated with the memory array using an analog to digital sense unit at block 704. Next, the method includes converting the analog signals into distributions of digital values using the analog to digital sense unit at block 706. For example, each distribution may be associated with a logical state (e.g., 0, 1, 00, 01, 10, 11) of single or multi-level memory array. The analog to digital sense unit sends the distributions of digital values to an error-correcting code (ECC) unit at block 708. A look-up table provides ECC parameters including error probability data associated with each digital value to the ECC unit at block 710.

The ECC unit executes an ECC algorithm to provide error correction using the error probability data at block 712. In one embodiment, the non-volatile look-up table is updated with error information associated with the memory array upon initiation of the memory device or upon given reading state or as a consequence of variations in the operating voltage or temperature detected by a suitable voltage sensor or a temperature sensor, respectively at block 714. The configurable non-volatile look-up table updates error probability data based on the distributions of digital values with error probability values being based on a distance of a digital value in the distribution from a reference level as illustrated in FIGS. 4 and 6.

Some portions of the detailed description are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g. as in a cause an effect relationship).

In the above detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An apparatus, comprising:
a memory array to store data;
an analog to digital sense unit coupled to the memory array, the analog to digital sense unit to sense analog signals associated with the memory array and to convert the analog signals into distributions of digital values;
an error-correcting code (ECC) unit coupled to the analog to digital sense unit, the ECC unit to receive the distributions of digital values from the analog to digital sense unit and to obtain error probability data having error probability values associated with the distributions of digital values; and
a configurable non-volatile look-up table coupled to the ECC unit, the configurable non-volatile look-up table to generate ECC parameters including the error probability data and provide the ECC parameters to the ECC unit for error correction, wherein the configurable non-volatile look-up table updates error probability data based on the distributions of digital values with error probability values being based on a distance of a digital value in the distribution from a reference level.

2. The apparatus of claim 1, wherein the ECC unit to execute an ECC algorithm to provide error correction using the error probability data.

3. The apparatus of claim 1, wherein the analog to digital sense unit to sense analog signals associated with memory cells of the memory array upon initiation of the apparatus.

4. The apparatus of claim 1, wherein the analog to digital sense unit to sense analog signals associated with memory cells of the memory array upon given reading state of the memory array.

5. The apparatus of claim 1, further comprising:
one or more additional memory arrays, wherein the ECC unit to provide error correction for two or more memory arrays.

6. A data processing device, comprising:
a processing unit having at least one processor core; and
system memory coupled to the processing unit, the system memory having an integrated circuit device comprising
a memory array to store data;
an analog to digital sense unit coupled to the memory array, the analog to digital sense unit to sense analog signals associated with the memory array and to convert the analog signals into distributions of digital values;
an error-correcting code (ECC) unit coupled to the analog to digital sense unit, the ECC unit to receive the distributions of digital values from the analog to digital sense unit and to obtain error probability data having error probability values associated with the distributions of digital values; and
a configurable non-volatile look-up table coupled to the ECC unit, the configurable non-volatile look-up table to generate ECC parameters including the error probability data and provide the ECC parameters to the ECC unit for error correction, wherein the configurable non-volatile look-up table updates error probability data based on the distributions of digital values with error probability values being based on a distance of a digital value in the distribution from a reference level.

7. The data processing device of claim 6, wherein the ECC unit to execute an ECC algorithm to provide error correction using the error probability data.

8. The data processing device of claim 6, wherein the digital values represent a current or voltage distribution of memory cells in the memory array.

9. A data processing device, comprising:
a processing unit having at least one processor core; and
system memory coupled to the processing unit, the system memory having an integrated circuit device comprising
a memory array to store data;
an analog to digital sense unit coupled to the memory array, the analog to digital sense unit to sense analog signals associated with the memory array and to convert the analog signals into distributions of digital values;
an error-correcting code (ECC) unit coupled to the analog to digital sense unit, the ECC unit to receive the distributions of digital values from the analog to digital sense unit and to obtain error probability data having error probability values associated with the distributions of digital values; and
a configurable non-volatile look-up table coupled to the ECC unit, the configurable non-volatile look-up table to generate ECC parameters including the error probability data and provide the ECC parameters to the ECC unit for error correction, wherein the non-volatile look-up table is configured to receive updated digital values based on variations in the cells current or variations in the resistance or threshold voltage distribution in the array.

10. The data processing device of claim 9, wherein the non-volatile look-up table is external or embedded within the ECC unit.

11. A method, comprising:
storing data in a memory array;
sensing analog signals associated with the memory array using an analog to digital sense unit;
converting the analog signals into distributions of digital values using the analog to digital sense unit;
sending the distributions of digital values from the analog to digital sense unit to an error-correcting code (ECC) unit;
generating error probability data associated with each digital value;
providing ECC parameters including error probability data to the ECC unit using a non-volatile look-up table; and
updating the non-volatile look-up table with updated error information associated with the memory array upon initiation of a memory device or upon given reading state of the memory array.

12. The method of claim 11, further comprising:
executing an ECC algorithm with the ECC unit to provide error correction using the error probability data.

13. A method, comprising:
storing data in a memory array;
sensing analog signals associated with the memory array using an analog to digital sense unit;
converting the analog signals into distributions of digital values using the analog to digital sense unit;
sending the distributions of digital values from the analog to digital sense unit to an error-correcting code (ECC) unit;
generating error probability data associated with each digital value; and
updating the non-volatile look-up table with updated error information associated with the memory array as a consequence of variations in the operating voltage or temperature detected by a suitable voltage sensor or a temperature sensor, respectively.

14. A method, comprising:
storing data in a memory array;
sensing analog signals associated with the memory array using an analog to digital sense unit;

converting the analog signals into distributions of digital values using the analog to digital sense unit;
sending the distributions of digital values from the analog to digital sense unit to an error-correcting code (ECC) unit; and
generating error probability data associated with each digital value, wherein the configurable non-volatile look-up table updates error probability data based on the distributions of digital values with error probability values being based on a distance of a digital value in the distribution from a reference level.

\* \* \* \* \*